(12) United States Patent
Gao

(10) Patent No.: US 11,439,046 B2
(45) Date of Patent: Sep. 6, 2022

(54) ELECTRONIC RACK LIQUID COOLING SYSTEM

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 59 days.

(21) Appl. No.: 16/685,718

(22) Filed: Nov. 15, 2019

(65) Prior Publication Data
US 2021/0153391 A1    May 20, 2021

(51) Int. Cl.
*H05K 7/20*    (2006.01)

(52) U.S. Cl.
CPC ..... *H05K 7/20818* (2013.01); *H05K 7/20318* (2013.01); *H05K 7/20327* (2013.01); *H05K 7/20827* (2013.01)

(58) Field of Classification Search
CPC . H05K 7/2029; H05K 7/20309–20327; H05K 7/20663; H05K 7/20681; H05K 7/20709; H05K 7/20818; H05K 7/20827; H05K 7/20881; H05K 7/20936; H05K 1/0203; H01L 23/427; H01L 23/473; H01L 23/34; F28F 15/02; F28D 15/02; F28D 15/0266; F28D 15/0275
See application file for complete search history.

(56) References Cited

U.S. PATENT DOCUMENTS

| | | | | |
|---|---|---|---|---|
| 6,550,530 B1* | 4/2003 | Bilski | ............... | F28D 15/06 |
| | | | | 165/104.26 |
| 10,238,011 B1* | 3/2019 | Cui | ............... | H05K 7/20781 |
| 10,905,030 B1* | 1/2021 | Fernandes | ......... | H05K 7/20263 |
| 2002/0007641 A1* | 1/2002 | Marsala | ............... | H01L 23/473 |
| | | | | 62/119 |
| 2011/0051372 A1* | 3/2011 | Barringer | .......... | H05K 7/20781 |
| | | | | 361/701 |
| 2013/0107447 A1* | 5/2013 | Campbell | ......... | H05K 7/20709 |
| | | | | 361/679.47 |
| 2013/0107453 A1* | 5/2013 | Chainer | ............ | H05K 7/20781 |
| | | | | 361/694 |

(Continued)

*Primary Examiner* — Zachary Pape
*Assistant Examiner* — Amir A Jalali
(74) *Attorney, Agent, or Firm* — Womble Bond Dickinson (US) LLP

(57) ABSTRACT

According to one embodiment, an electronic rack cooling system includes a liquid manifold and a vapor manifold. The system includes a cold plate configured to mount on a processor of a piece of information technology (IT) equipment for liquid cooling. The cooling device such as the cold plate is coupled to the liquid manifold to receive cooling liquid and is coupled to the vapor manifold that receives vapor produced by the cold plate when heat generated by the processor is transferred into the cooling liquid through the cold plate. The system also includes a heat exchanger coupled to the vapor manifold to receive the vapor and configured to condense the vapor back into cooling liquid. The system also includes a fluid control unit coupled between the liquid manifold and the heat exchanger to create a heat exchanging loop, and configured to circulate the cooling liquid within the heat exchanging loop. Multiple methods of implementing the proposed thermal system and the loop design on a rack and a data center.

20 Claims, 12 Drawing Sheets

(56) References Cited

U.S. PATENT DOCUMENTS

2014/0133099 A1\* 5/2014 Campbell .......... H05K 7/20818
  361/698
2018/0299933 A1\* 10/2018 Cui ................... H05K 7/20781
2018/0343773 A1\* 11/2018 Kulkarni ............ H05K 7/20327

\* cited by examiner

ELECTRONIC RACK LIQUID COOLING SYSTEM

FIELD

Embodiments of the present disclosure relate generally to a cooling system for electronic racks.

BACKGROUND

Thermal management for a data center that includes several active electronic racks is critical to ensure proper performance of servers and other IT equipment (e.g., performing IT data processing services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use cooling air to cool the IT equipment. The cooling air is recirculated using cooling units that extract heat captured by the cooling air. One commonly used cooling unit is a computer room air conditioning (CRAC) unit that is a device that intakes hot exhaust air and supplies cooling air into the data center to maintain the data center's thermal environment. The CRAC is an air cooling unit that is widely used in existing air cooled data centers, and there are many other types of solutions for air cooled data centers. Also, a majority of existing data centers are air cooled.

Recently, data centers have been deploying more high-power density electronic racks, where more high-density chips are packaged closer together to provide more processing power. This is especially the case due to developments in artificial intelligence (AI) and cloud-based services, which require high performance and high power density processors, such as control processing units (CPUs) and graphic processing units (GPUs). Cooling these high-density racks by maintaining a proper thermal environment may be an issue with existing cooling systems, such as a CRAC unit. For instance, although the CRAC unit may maintain the thermal environment with more conventional (or lower-density) racks, the unit may be unable to effectively cool high-power density racks because they may generate heat load at a higher rate due to the higher density electronics. In some cases, liquid cooling becomes a more efficient and feasible cooling solution in high power density or high heat flux scenarios.

When IT equipment is designed for liquid cooling, a data center infrastructure should be able to support liquid cooling or able to support operating liquid cooled equipment in its air cooled environment. This, however, becomes a challenge for many existing data centers which employ air cooling. In addition, most data centers and cooling infrastructures are designed for a limited period of time (e.g., ten years of lifetime). Retrofitting a data center that uses air cooling may cost a considerable amount of money and impact normal operations due to construction.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
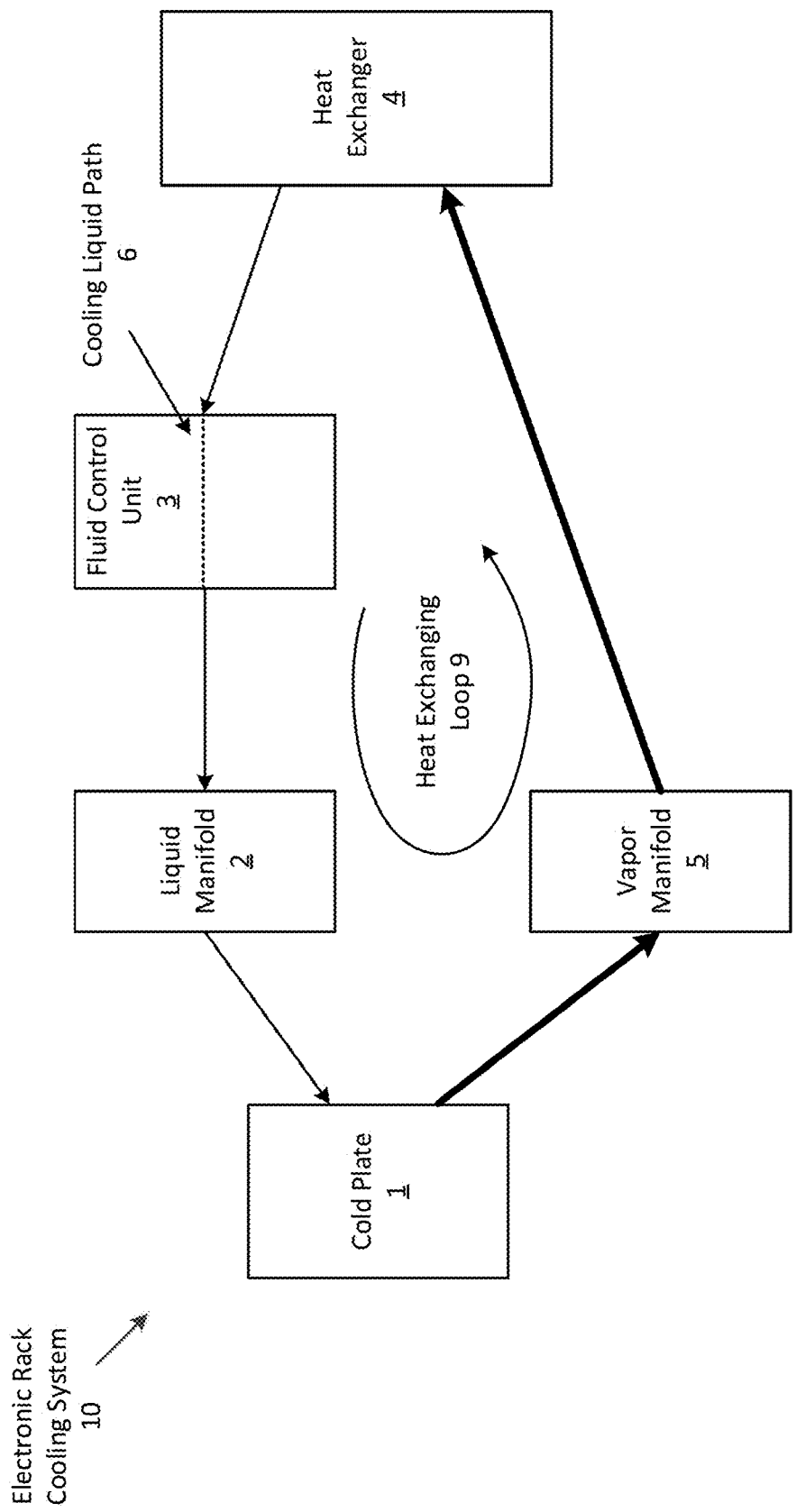
FIG. 1 is a block diagram illustrating an example of a cooling system for an electronic rack according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problem of deploying liquid cooled IT equipment in an air cooling data center. The solution proposed in the current disclosure provides a design for deploying a liquid cooled environment in an air cooled data center environment. Specifically, the present disclosure describes an electronic rack cooling system that liquid cools IT equipment contained therein, which can be directly deployed within an existing air-cooled data center. The electronic rack cooling system includes a two-phase heat exchanging loop that uses an air-to-liquid heat exchanger. The heat exchanger cools IT equipment within the rack by transferring heat to cooling air being supplied by the air-cooled data center. Thus, electronic racks with the presently disclosed cooling system that liquid cools IT equipment may be deployed within existing air-cooled data centers, without requiring the centers to upgrade their infrastructure. In addition, the electronic rack cooling system may be used in a hybrid environment in which air-cooled IT equipment and liquid-cooled IT equipment may coexist within the same rack.

According to one embodiment, an electronic rack cooling system that includes a liquid manifold and a vapor manifold. The system also includes a cold plate that is configured to mount on a processor of a piece of information technology (IT) equipment for liquid cooling. The cold plate is coupled to the liquid manifold to receive cooling liquid. The vapor manifold is coupled to the cold plate to receive vapor that is produced by the cold plate when heat generated by the processor is transferred into the cooling liquid by the cold plate thereby causing at least some of the cooling liquid to turn into the vapor. The system also includes a heat exchanger coupled to the vapor manifold to receive the vapor and configured to condense the vapor back into cooling liquid. The system also includes fluid control unit coupled between the liquid manifold and the heat exchanger to create a heat exchanging loop, and configured to circulate the cooling liquid within the heat exchanging loop by drawing the cooling liquid condensed by the heat exchanger and providing the cooling liquid to the liquid manifold.

In one embodiment, the fluid control unit includes a cooling liquid path that couples an outlet supply port of the heat exchanger to the liquid manifold. The cooling liquid path includes a reservoir that is configured to hold cooling liquid condensed by the heat exchanger and a liquid pump that is configured to draw cooling liquid from the reservoir and push the drawn cooling liquid to the cold plate via the liquid manifold. In another embodiment, the fluid control unit is coupled between the vapor manifold and the heat exchanger by having a vapor path that couples an inlet return port of the heat exchanger to the vapor manifold. The vapor path includes a vapor pump that is configured to draw vapor from the vapor manifold and push the drawn vapor to the heat exchanger.

In one embodiment, the fluid control unit and the heat exchanger are an integrated unit. In another embodiment, the heat exchanger is a two-phase air-to-liquid heat exchanger that transfers latent heat carried by the vapor received from the vapor manifold to cooling air. In some embodiments, the system further includes at least one fan that is configured to move the cooling air into the heat exchanger.

According to another embodiment, an electronic rack includes several pieces of IT equipment arranged in a stack for providing data processing services, each piece of IT equipment including one or more processors, at least one of the processors is mounted with a cold plate on the top of it. The electronic rack includes a similar electronic rack cooling system as previously described.

In one embodiment, the electronic rack includes a rack frame that houses the several pieces of IT equipment, the liquid manifold, the vapor manifold, and the fluid control unit. The heat exchanger is a rack door heat exchanger coupled to a backend of the rack frame. In another embodiment, the rack door heat exchanger includes an air inlet on a side proximate to the rack frame and an air outlet on a side distal to the rack frame. The rack door heat exchanger is mainly a two-phase air-to-liquid heat exchanger coil that transfers heat carried by the vapor received from the vapor manifold to cooling air that enters the air inlet to produce hot exhaust air that exits the air outlet. In one embodiment, the electronic rack further includes at least one fan that is configured to push cooling air into an air inlet of the heat exchanger. According to another embodiment, a data center includes several electronic racks, where each of the electronic racks is similar to the electronic racks previously described.

FIG. 1 is a block diagram illustrating an example of a cooling system for an electronic rack according to one embodiment. Specifically, this figure illustrates an electronic rack cooling system 10 (hereafter may be referred to as "cooling system") for liquid cooling IT equipment of an electronic rack. The system includes at least one cold plate 1 or any other types of liquid cooling devices, either component level or server level, a liquid manifold 2, a fluid control unit 3, a heat exchanger 4, and a vapor manifold 5.

As used herein, "to couple" one component to another component may refer to fluidly coupling the two components together in order to allow a fluid, such as a cooling liquid and/or a vapor, to flow between the two components. For example, each of the components of the system 10 may couple to at least one other component in order to create a heat exchanging loop. Specifically, the cold plate 1 couples to the liquid manifold 2, which couples to the fluid control unit 3, which couples to the heat exchanger 4, which couples to the vapor manifold, which is also coupled to the cold plate. The coupling of the components of the system creates a heat exchanging loop 9 as described herein. For instance, cooling liquid flows from the heat exchanger to the cold plate, via the liquid manifold and fluid control unit. The cold plate is configured to thermally couple to a component (e.g., at least one processor of) a piece of IT equipment, such as a blade server mounted in an electronic rack. In one embodiment, the cold plate is a part of the piece of IT equipment (e.g., where the plate is integrated therein). When the processor is active, heat is generated which is transferred into cooling liquid that is flowing within the cold plate thereby causing at least some of the cooling liquid to turn into a vapor. To complete the loop, the vapor produced by the cold plate flows to the heat exchanger via the vapor manifold. In one embodiment, the heat exchanger is configured to condense the vapor back into cooling liquid, which is then recirculated back to the cold plate.

In one embodiment, the cooling system 10 may include one or more heat exchanging loops associated with one or more cold plates. Specifically, the liquid manifold 2 and the vapor manifold 5 are configured to couple to one or more cold plates to create separate heat exchanging loops within the system 10. The liquid manifold distributes cooling liquid received from the heat exchanger to the cold plates, and the vapor manifold collects vapor produced by the cold plates and provides the vapor to the heat exchanger. In one embodiment, the heat exchanger is a two-phase air-to-liquid heat exchanger that is configured to transfer heat contained within vapor received from the vapor manifold to cooling air in order to condense the vapor into cooling liquid. For example, the heat exchanger may include a condensing coil through which the vapor travels. The cooling air enters an inlet of the heat exchanger and passes over the coil, drawing the heat away from the coil and producing hot exhaust air that is expelled out an outlet heat exchanger, resulting is the condensed cooling liquid.

In one embodiment, the cooling liquid may be any type of thermally conductive dielectric liquid. In another embodiment, the liquid may be a non-toxic liquid. In some embodiments, the liquid may be designed and operated to have a low boiling point (e.g., below a threshold operating temperature for at least some of the major components, such as a processor, of IT equipment that is to be mounted in an electronic rack).

The fluid control unit 3 is configured to circulate the cooling liquid within the heat exchanging loop 9 by drawing the cooling liquid condensed by the heat exchanger and providing (or pushing) the cooling liquid to the liquid manifold 2. Specifically, the unit includes a cooling liquid path 6 that couples an outlet supply port of the heat exchanger (e.g., via a supply line) to the liquid manifold and through which cooling liquid passes through the unit. More about how the fluid control unit circulates the cooling liquid is described herein.

In one embodiment, the system 10 may remain active for a period of time, even if there is a failure in the fluid control unit. For example, when the fluid control unit includes a mechanical component, such as a pump that is configured to circulate the cooling liquid, the unit may fail when the pump fails. In response to the fluid control unit failing, the heat exchanging loop may remain active to draw heat away from the processor on which the cold plate is mounted by utilizing (or enabling) phase change natural convection heat transfer. Specifically, heat generated by the processor is transferred using natural convection (fluid or vapor is circulated using density difference and gravity) without the need of a mechanical pump. As a result, the vapor produced by the heat transfer may flow to the vapor manifold and into the condenser.

Figure 2:
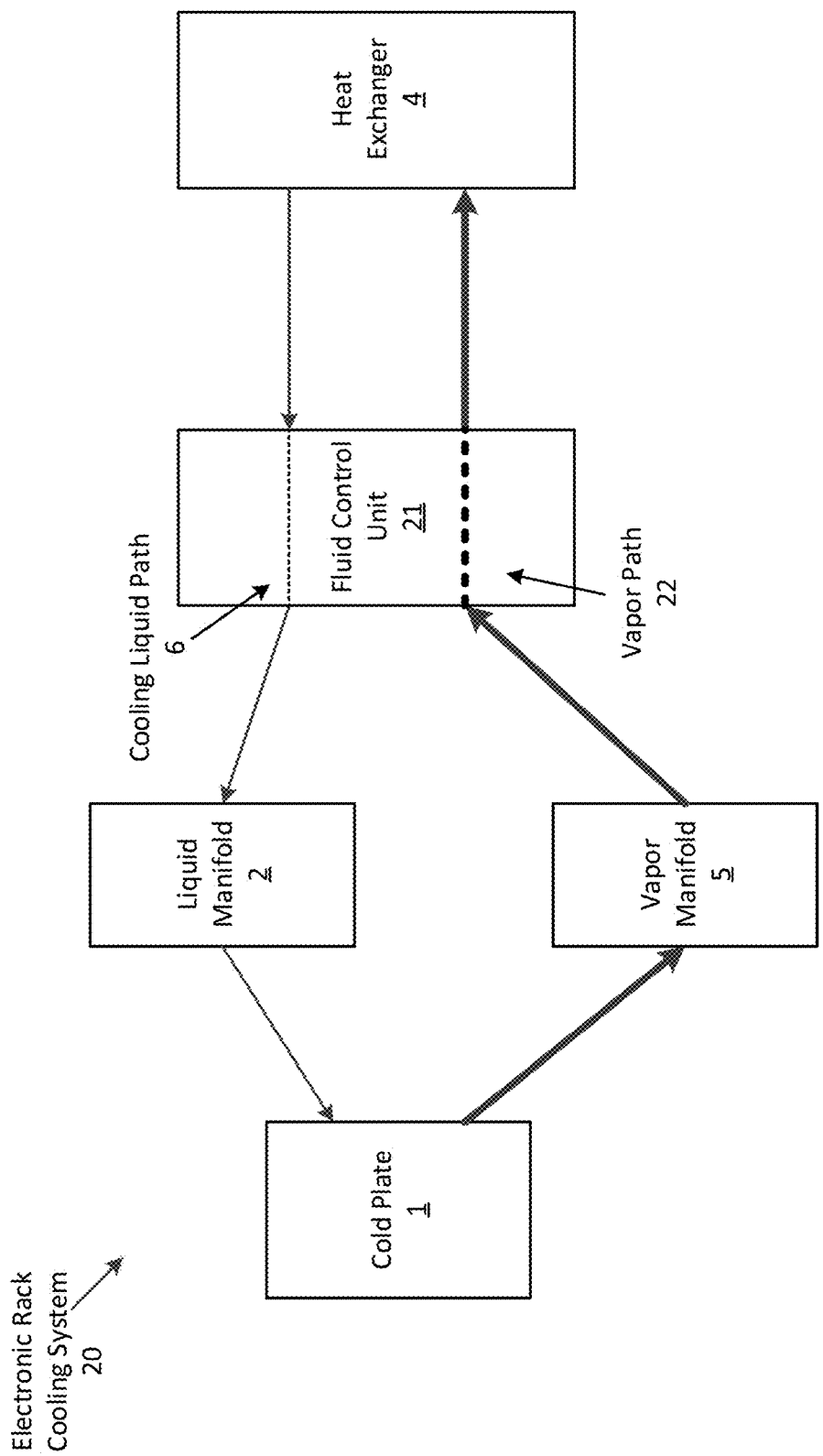
FIG. 2 is a block diagram illustrating another example of an electronic rack cooling system according to one embodiment.

FIG. 2 is a block diagram illustrating another example of an electronic rack cooling system according to one embodiment. Specifically, this figure shows an electronic rack cooling system 20 that is similar to the cooling system 10, except this system includes a fluid control unit 21 that (separately) couples the liquid manifold 2 and the vapor manifold 5 to the heat exchanger 4. In contrast to the fluid control unit 3 of FIG. 1 that only includes the cooling liquid path 6, this unit also includes a vapor path 22. The vapor path couples an inlet return port of the heat exchanger (e.g., via a vapor return loop) to the vapor manifold. The unit 21 circulates cooling liquid via the cooling liquid path 6 from the heat exchanger to the liquid manifold 2, and circulates vapor via the vapor path 22 from the vapor manifold 5 to the heat exchanger 4. Thus, the heat exchanging loop 9 passes through the fluid control unit 21 twice in opposite directions. In one embodiment, the fluid control unit may be coupled between different components within the system 20. For instance, the fluid control unit 21 may be coupled between the cold plate 1 and the vapor manifold 5. In another embodiment, the fluid control unit 3 may include at least some of the components contained within fluid control unit 21, such as a liquid pump and a reservoir as described herein. More about how the fluid control unit circulates the cooling liquid is described herein.

Figure 3:
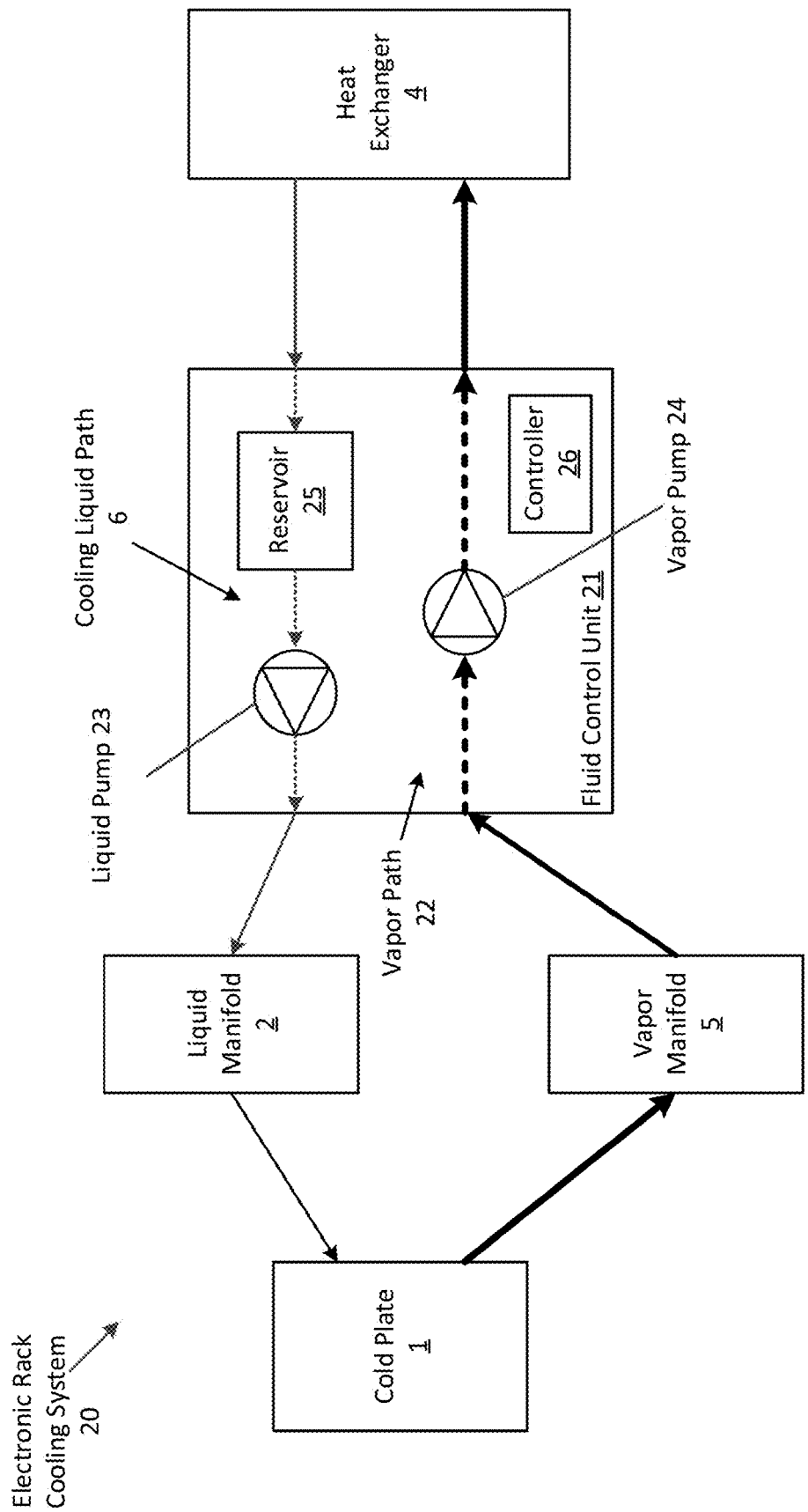
FIG. 3 is a block diagram illustrating an example of a fluid control unit of an electronic rack cooling system according to one embodiment.

FIG. 3 is a block diagram illustrating an example of a fluid control unit of an electronic rack cooling system according to one embodiment. Specifically, this figure provides more details of the fluid control unit 21. As shown, the unit 21 includes a liquid pump 23, a reservoir 25, a vapor pump 24, and a controller 26. In one embodiment, the fluid control unit 21 may include more or less components. For instance, the unit 21 may include multiple liquid pumps (e.g., one pump that is upstream from the reservoir and another pump that is downstream from the reservoir). As another example, the fluid control unit 21 may not include a controller 26, but instead may receive control signals from a separate controller. More about the controller is described herein.

The liquid pump 23 and the reservoir 25 are part of the cooling liquid path 6. The reservoir is configured to hold cooling liquid condensed by the heat exchanger. The liquid pump is configured to draw cooling liquid from the reservoir and push the drawn cooling liquid to the cold plate 1 via the liquid manifold. In one embodiment, the liquid pump may be any type of mechanical pump. In one embodiment, the condensed cooling liquid may flow (or drip) into the reservoir from the heat exchanger 4. For example, an input port of the (cooling liquid path of the) fluid control unit may couple to an output supply port of the heat exchanger via a supply line (or pipe). The condensed cooling liquid may flow from the output supply port, through the supply line, and into the fluid control unit. In one embodiment, the fluid control unit (or rather the reservoir) may be positioned lower than an output supply port of the heat exchanger. In another embodiment, the reservoir may be separate from the fluid control unit 21. In some embodiments, the fluid control unit may not include a reservoir. In that case, the liquid pump may draw condensed cooling liquid directly from the heat exchanger.

The vapor pump 24 is a part of the vapor path 22. The vapor pump is configured to draw vapor from the vapor manifold 5 and push the drawn vapor into the heat exchanger 4. In one embodiment, the vapor pump may be any type of pump that is able to circulate a gas, such as an air compressor. Specifically, an output port of the (vapor path of the) fluid control unit may couple to an inlet return port of the heat exchanger via a return line (or pipe), which carries the vapor from the control unit to the heat exchanger.

In one embodiment, the current design proposed also enables the cooling system 10 to function for a period of time even if there is a failure with the fluid control unit or any of its internal components. For instance, the system may switch to a natural convection cooling mode in these failure scenarios and continue maintaining the cooling for a period of time. Thus, as described herein, when the system is deployed on an electronic rack, the IT equipment that is liquid cooled by the system may continue to remain active, even when there is such a failure.

The controller 26 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the controller may be a circuit with a combination of analog elements (e.g., resistors, capacitors, inductors, etc.) and/or digital elements (e.g., logic-based elements, such as transistors, etc.). The controller may also include memory. In one embodiment, the controller may be a part (or integrated) into the fluid control unit 21 (and/or the fluid control unit 6). In another embodiment, the controller may be one of the pieces of IT equipment that is mounted in an electronic rack, as described herein.

In one embodiment, the controller 26 is communicatively coupled (e.g., wired and/or wirelessly connected) to the liquid pump 23 and/or vapor pump 24. The controller is configured to control at least one of the pumps (e.g., by transmitting a control signal to control circuitry of the pump, such as an electronic switch) in order to activate the heat-exchanging loop 9. Specifically, the controller may monitor certain criteria to determine whether or not cooling liquid should be pushed to the cold plate and/or whether or not vapor should be pumped to the heat exchanger. For example, the controller may monitor a temperature (e.g., surface temperature) using a temperature sensor coupled to the cold plate to determine whether the component (e.g., processor) on which the cold plate is mounted is operational or the cold plate is properly mounted. If the temperature exceeds a threshold temperature, the controller may activate the liquid pump and/or the vapor pump to drive the fluid recirculation faster for a better heat transfer. In another embodiment, the controller may monitor the chip temperature such as the chip case temperature. In one embodiment, the controller may adjust a flow rate of cooling liquid and/or vapor within the heat exchanging loop by adjusting a rate at which the liquid pump pushing cooling liquid and/or a rate at which the vapor pump pushes vapor. The controller may adjust the rate based on the criteria mentioned herein. For instance, the flow rate at which the liquid pump operates may be based on the temperature reading (e.g., a higher reading may result in a higher flow rate of cooling liquid).

Figure 4:
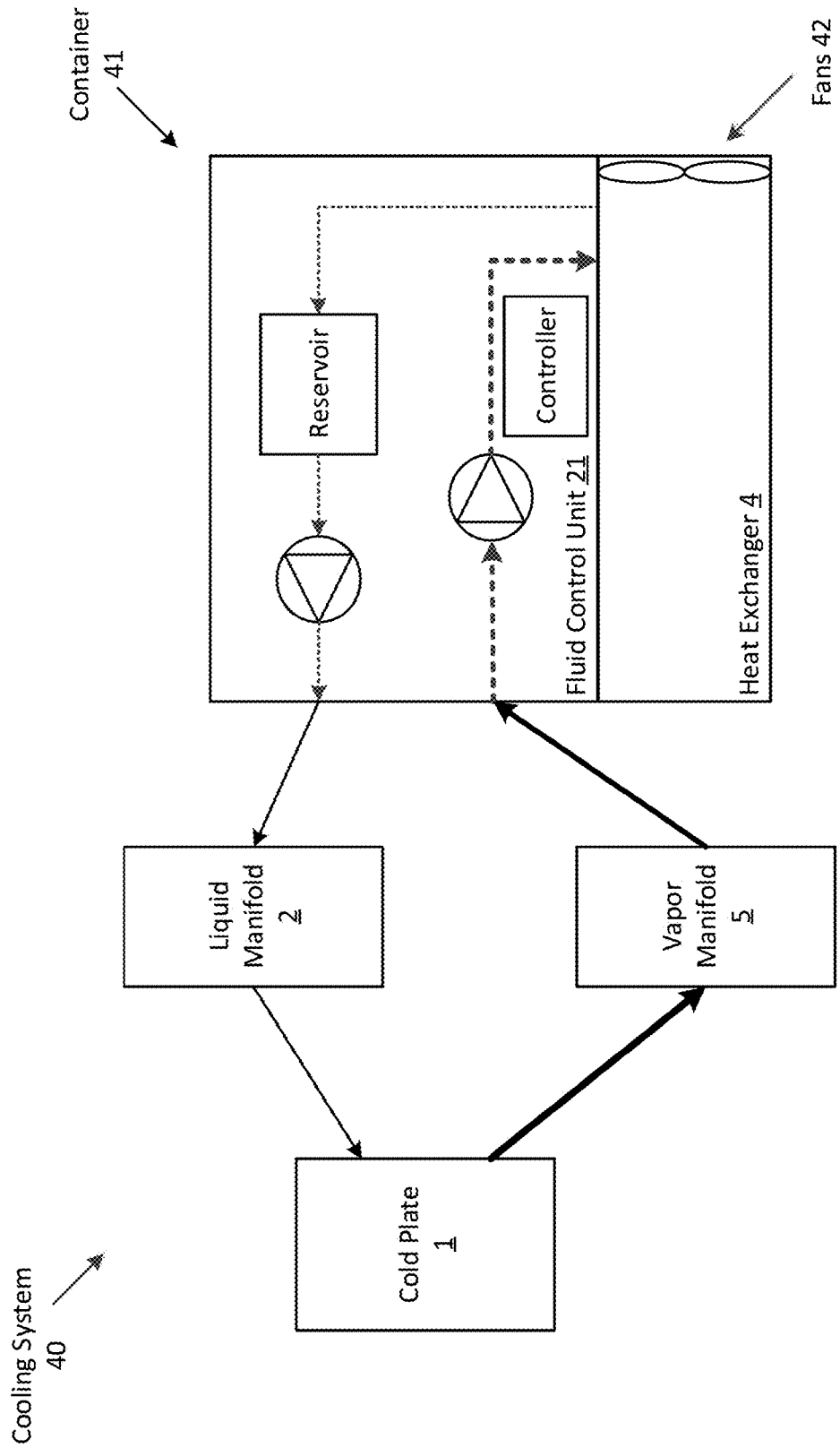
FIG. 4 is a block diagram illustrating another example of a fluid control unit of an electronic rack cooling system according to one embodiment.

FIG. 4 is a block diagram illustrating another example of a fluid control unit of an electronic rack cooling system according to one embodiment. Specifically, this figure illustrates that the fluid control unit 21 and the heat exchanger 4 are an integrated unit inside one container 41. For instance, the fluid control unit may be a part of the heat exchanger (e.g., within a container), or vice a versa. In one embodiment, integrating the fluid control unit with the heat exchanger reduces a number of ports (or connection points) that are required to form the heat exchanging loop. In particular, each of the arrows illustrated may represent liquid (or vapor) lines, and each point at which the arrows intersect a component may be a port at which the line couples. More about the lines and ports are described herein.

In this figure, there are four (external) lines, two liquid lines that couple the cold plate, the liquid manifold, and the integrated unit; and two vapor lines that couple the cold plate, the vapor manifold, and the integrated unit. Since the fluid control unit and the heat exchanger is an integrated unit, the vapor and liquid paths of the control unit may couple directly to the inlet and outlet, respectively, of a condenser coil within the heat exchanger. This is in contrast to the other systems described herein. For instance, cooling system 10 includes five lines (three liquid lines and two vapor lines), and cooling system 20 includes six lines (three liquid lines and three vapor lines). In one embodiment, reducing the number of lines coupling the components of the system together reduces the chance of leaks within the system. A high component level integration increases solution reliability.

Also illustrated in this figure are one or more fans 42 that are configured to push ambient air into the heat exchanger. For instance, the fans may push ambient air into an air inlet of the heat exchanger. In one embodiment, when the fans are positioned downstream, the fans may draw hot exhaust air out of an air outlet of the heat exchanger. In one embodiment, the fans may be a part of (integrated into) the heat exchanger 4. In another embodiment, the fans may be separate from the heat exchanger. For instance, the fans may be coupled to an air inlet of the heat exchanger via one or more air ducts. In one embodiment, the controller 26 may be communicatively coupled to the fans 42 and may be configured to adjust (or set) a fan speed based on the criteria described herein.

Figure 5:
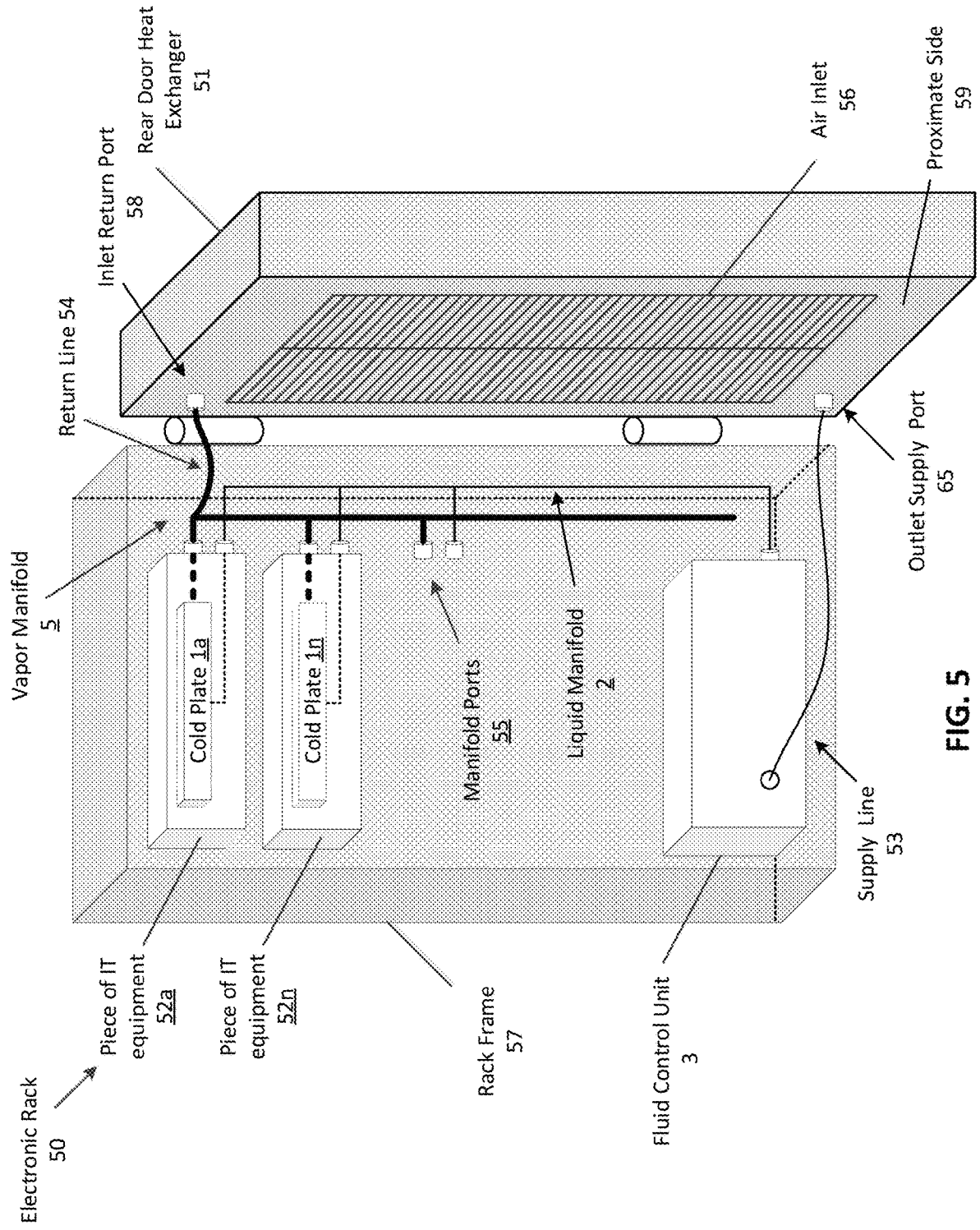
FIG. 5 is an example of an electronic rack with a cooling system according to one embodiment.

FIG. 5 is an example of an electronic rack with a cooling system according to one embodiment. Specifically, this figure shows a perspective view of the electronic rack 50 that includes an electronic rack cooling system, such as cooling system 10 of FIG. 1. The rack 50 includes a rack frame 57 and a rear door heat exchanger 51. In one embodiment, the rack 50 may be any type of electronic rack that is configured to house one or more pieces of IT equipment in one or more slots within the frame 57. As shown, the frame 57 includes several pieces of IT equipment 52*a*-52*n* that are arranged in a stack for providing data processing services, each piece of IT equipment may include one or more processors. Each of the pieces of IT equipment includes a cold plate 1 (e.g., 1*a* for equipment 52*a* and 1*n* for equipment 5*n*), which may be mounted on at least one respective processor.

The frame 57 also includes the liquid manifold 2, the vapor manifold 5, and the fluid control unit 3. Both manifolds run at least a portion of the height of the rack frame. The rack includes one or more pairs of manifold ports 55. Each pair of manifold ports includes a supply port for the liquid manifold and a corresponding vapor port for the vapor manifold. In this example, the rack includes three pairs of manifold ports, where the top two pairs are coupled to the pieces of IT equipment. Thus, a supply port is coupled to the piece of IT equipment 52*a* to allow liquid to flow into the cold plate 1*a* and a return port is coupled to the piece of IT equipment 52*a* to allow vapor produced by the cold plate 1*a* to enter the vapor manifold. In one embodiment, the manifold ports 55 may couple directly to the cold plates.

Also illustrated, the fluid control unit 3 is coupled to a port at the end of the liquid manifold 2, which when coupled allows cooling liquid to flow from the (liquid path of the) fluid control unit, into the manifold 2.

Figure 6:
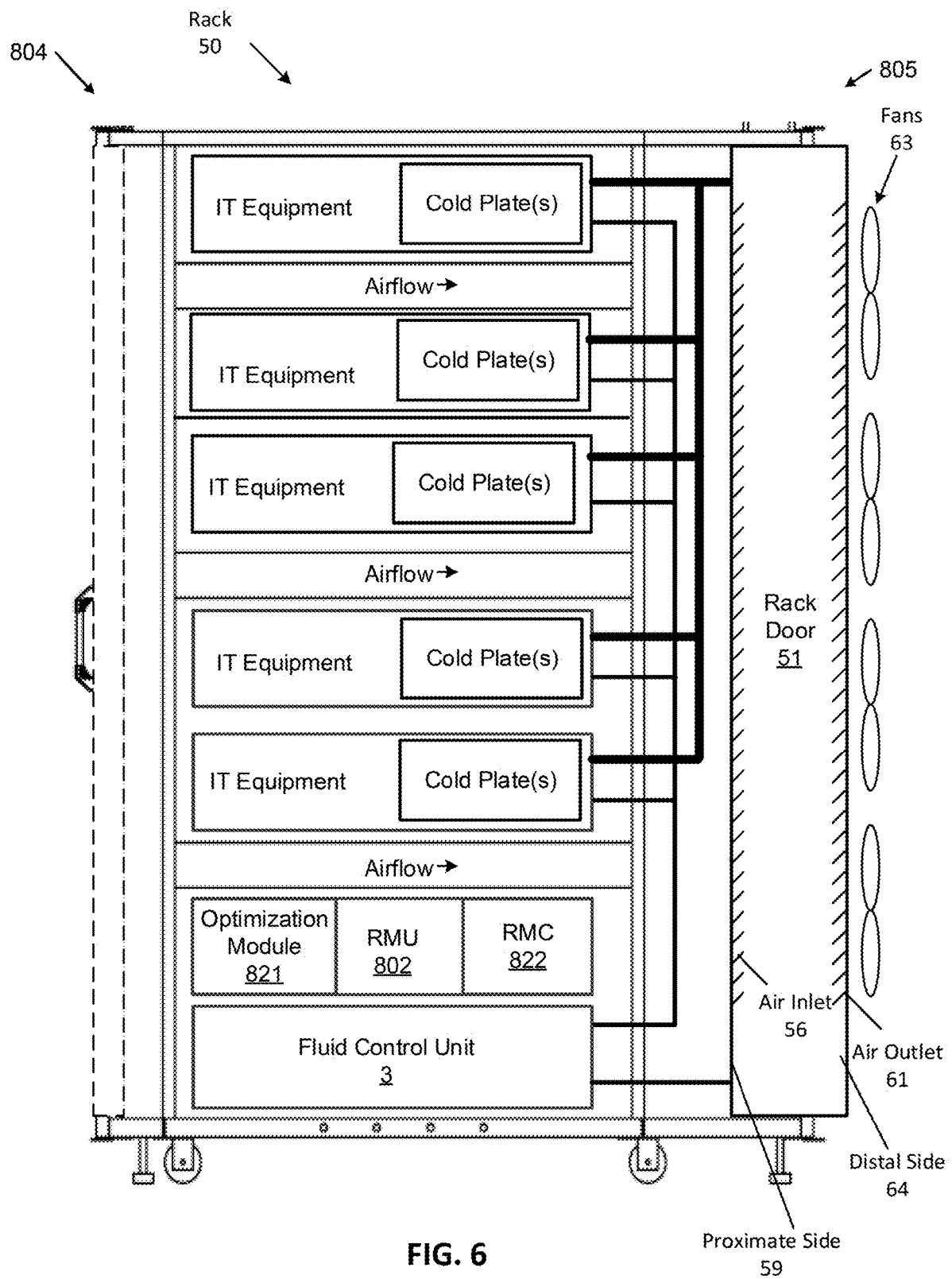
FIG. 6 shows another view of the electronic rack according to one embodiment.

The rear door heat exchanger 51 includes an inlet return port 58, an output supply port 65, and air inlet 56, and an air outlet 61 (as shown in FIG. 6). As illustrated, on a side 59 proximate to the rack frame (e.g., a side which when the door is closed is inside the rack frame), the rear door includes both ports and the air inlet. On a side distal to the rack frame (e.g., side 64 as shown in FIG. 6, which is a side outside the rack frame when the door is closed), the rear door includes the air outlet. In one embodiment, the air inlet and air outlet may be structures that enable the flow of air into (or out of) the rear door heat exchanger. For instance, the inlet/outlet may be a louver. As another example, the inlet/outlet may be a vent or screen. The inlet return port 58 is coupled to a return line 54, which is coupled to (or a part of) the vapor manifold. The outlet supply port 65 is coupled to a supply line 53, which is coupled to (a port of) the fluid control unit 3. During operation, cooling air flows from the front of the electronic rack 50, through the rack, and into the rear door heat exchanger via the air inlet. The cooling air passes over the condensing coil that is inside the rear door, and exits the air outlet 61 as hot exhaust air.

In one embodiment, each of the ports described herein may include (or be) connectors that are configured to removably couple the components described herein together. For example, the manifold ports 55, outlet supply port 65, and the inlet return port 58 may be connectors such as dripless blind mating quick disconnects. For instance, each of these ports may be female dripless connectors. In this case, the end of the supply line 53 and the end of the return line 54 that couples to the corresponding supply and return ports may have male dripless connectors. Similarly, the pieces of IT equipment may include corresponding male dripless connectors that are used to couple to the manifold ports 55. In one embodiment, the connectors may be any type of connector that enables a technician to couple the components together. Thus, the output supply port 65 and inlet return port 58 enable the rear door heat exchanger to be connected/disconnected to/from the heat exchanging loop, which may occur during maintenance. In one embodiment, the fluid control unit 3 may include similar connectors.

In one embodiment, the supply line 53 and return line 54 (and the manifolds) may be composed of any material. For instance, the lines may be composed of metal, such as copper, a polymer (e.g., an EPDM rubber), and/or plastic. In one embodiment, the lines may be composed of a flexible material, such as rubber. For instance, both lines may be flexible to allow the rear door to open/close. In one embodiment, the return line may be different than the supply line. For example, the return line may have a diameter that is larger than a diameter of the supply line. Similarly, the vapor manifold may be composed of lines/pipes that have a larger diameter than the lines/pipes of the liquid manifold.

FIG. 6 is a block diagram illustrating an example of an electronic rack according to one embodiment. Specifically, this figure shows a side (cross-sectional) view of the rack 50. Electronic rack 50 may include one or more server slots to contain one or more servers respectively. Each server includes one or more pieces of IT equipment with one or more electronic components (e.g., processors, memory, storage devices, network interfaces). According to one embodiment, electronic rack 50 includes, but is not limited to, rack management unit (RMU) 802 (optional), one or more pieces of IT equipment, which may be any type of IT equipment, such as server blades, and fluid control unit 3. Each of the pieces of IT equipment includes one or more cold plates that are coupled to the liquid manifold and vapor manifold. The equipment 503 can be inserted into an array of server slots respectively from frontend 804 or backend 805 of electronic rack 50.

Note that although there are only five pieces of IT equipment shown here, more or fewer pieces of IT equipment may be maintained within electronic rack 50. Also note that the particular positions of components within the rack are shown for the purpose of illustration only; other arrangements or configurations of these components may also be implemented. Note that electronic rack 50 can be either open to the environment or partially contained by a rack container, as long as the cooling fans, such as fans 63, can generate airflows from the frontend to the backend. Thus, in this example, the fans pull ambient air from the frontend and into an air inlet of the back door heat exchanger 51.

In one embodiment, the rack 50 may include at least one fan 63, which may be associated with at least one of the pieces of IT equipment. In another embodiment, the rack door may include at least one fan. For example, the fans 63 may be integrated within the rear door 51. In this embodiment, however, the fan is mounted on the backend of the rear door 51 to generate airflow flowing from frontend 804, traveling through the air space of the equipment, entering the air inlet 56, and existing the air outlet 61 at backend 805 of electronic rack 50. In one embodiment, the fan may be mounted on the front end 804. In another embodiment, a fan may be mounted on the backend of at least some of the other IT equipment.

Each of the pieces of IT equipment may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to a cold plate as described herein. One piece of IT equipment may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 50 further includes optional RMU 802 configured to provide and manage power supplied to the equipment, at least one fan, and/or the fluid control unit 3. Optimization module 821 and RMC 822 can communicate with a controller (e.g., controller 22) in some of the applications.

In one embodiment, RMU 802 includes optimization module 821 and rack management controller (RMC) 822. RMC 822 may include a monitor to monitor operating status of various components within electronic rack 50, such as, for example, the (cold plates of the) equipment and one or more fans. Specifically, the monitor receives operating data from various sensors representing the operating environments of electronic rack 50. For example, the monitor may receive operating data representing temperatures of the processors, cooling liquid, and airflows, which may be captured and collected via various temperature sensors. The monitor may also receive data representing the fan power generated by the fan and pump power generated by the liquid pump and/or vapor pump of the fluid control unit., which may be proportional to their respective speeds. These operating data are referred to as real-time operating data. Note that the monitor may be implemented as a separate module within RMU 802.

Based on the operating data, optimization module 821 performs an optimization using a predetermined optimization function or optimization model to derive a set of optimal fan speeds for one or more fans and an optimal pump speed for the liquid pump and/or vapor pump of the fluid control unit, such that the total power consumption of the pumps/fans reaches minimum, while the operating data associated with the pumps/fans are within their respective designed specifications. Once the optimal pump speed and optimal fan speeds have been determined, RMC 822 may transmit control signals to the controller 22, which then adjusts the pump speeds. In one embodiment, the RMC 822 may directly adjust the pump speeds.

In one embodiment, the rack 50 may include additional components. For example, the rack may include a power supply unit (PSU) and/or a battery backup unit (BBU). The PSU may include the necessary circuitry (e.g., an alternating current (AC) to direct current (DC) or DC to DC power converter, backup battery, transformer, or regulator, etc.,) to provide power to the rest of the components of electronic rack 50. In one embodiment, the BBU may be configured to provide battery backup power to the electronic when the (main) power supply (provided by the PSU) is unavailable (e.g., a power outage).

Figure 7:
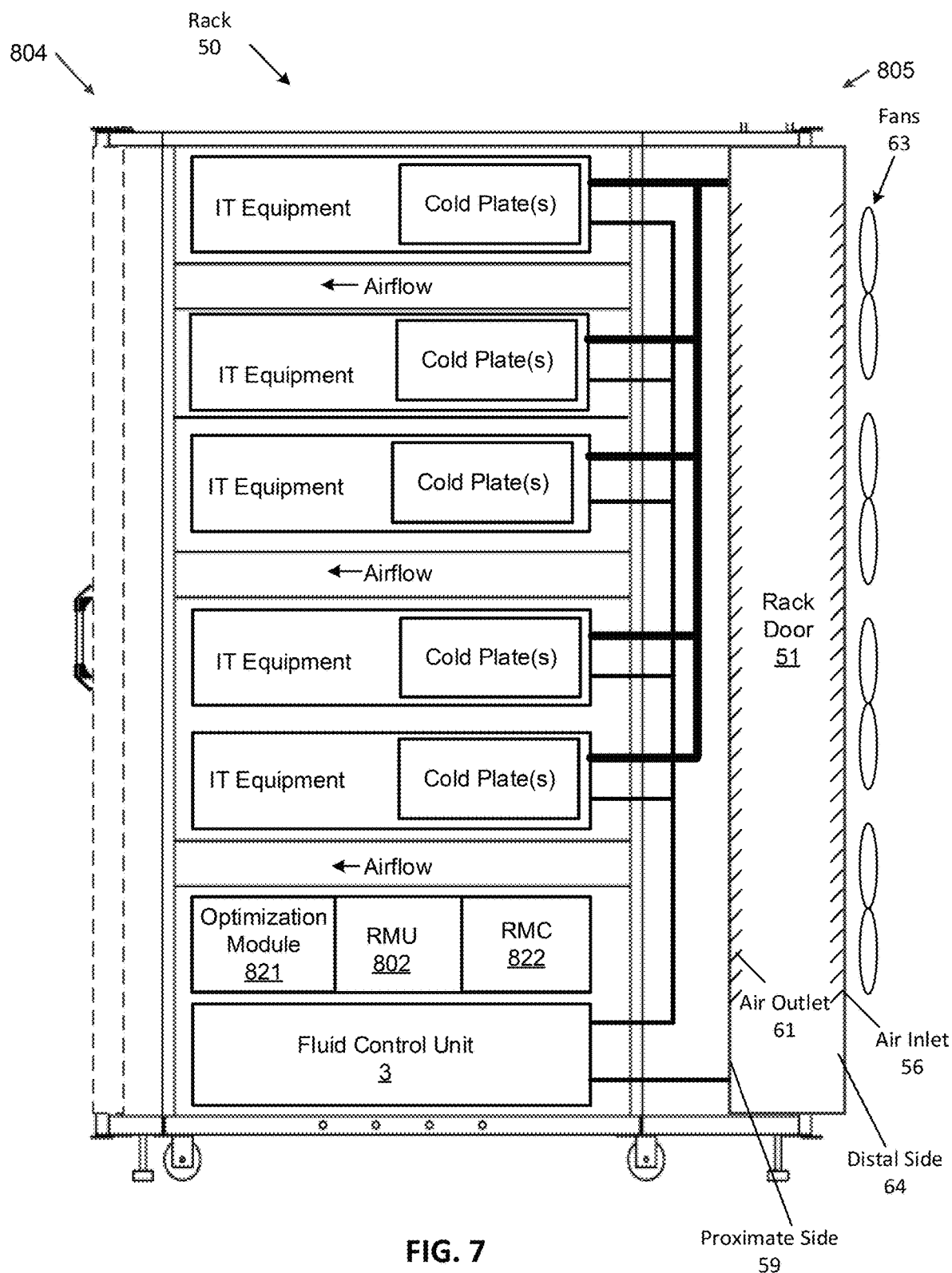
FIG. 7 is an example of an electronic rack with a cooling system according to one embodiment.
Figure 8:
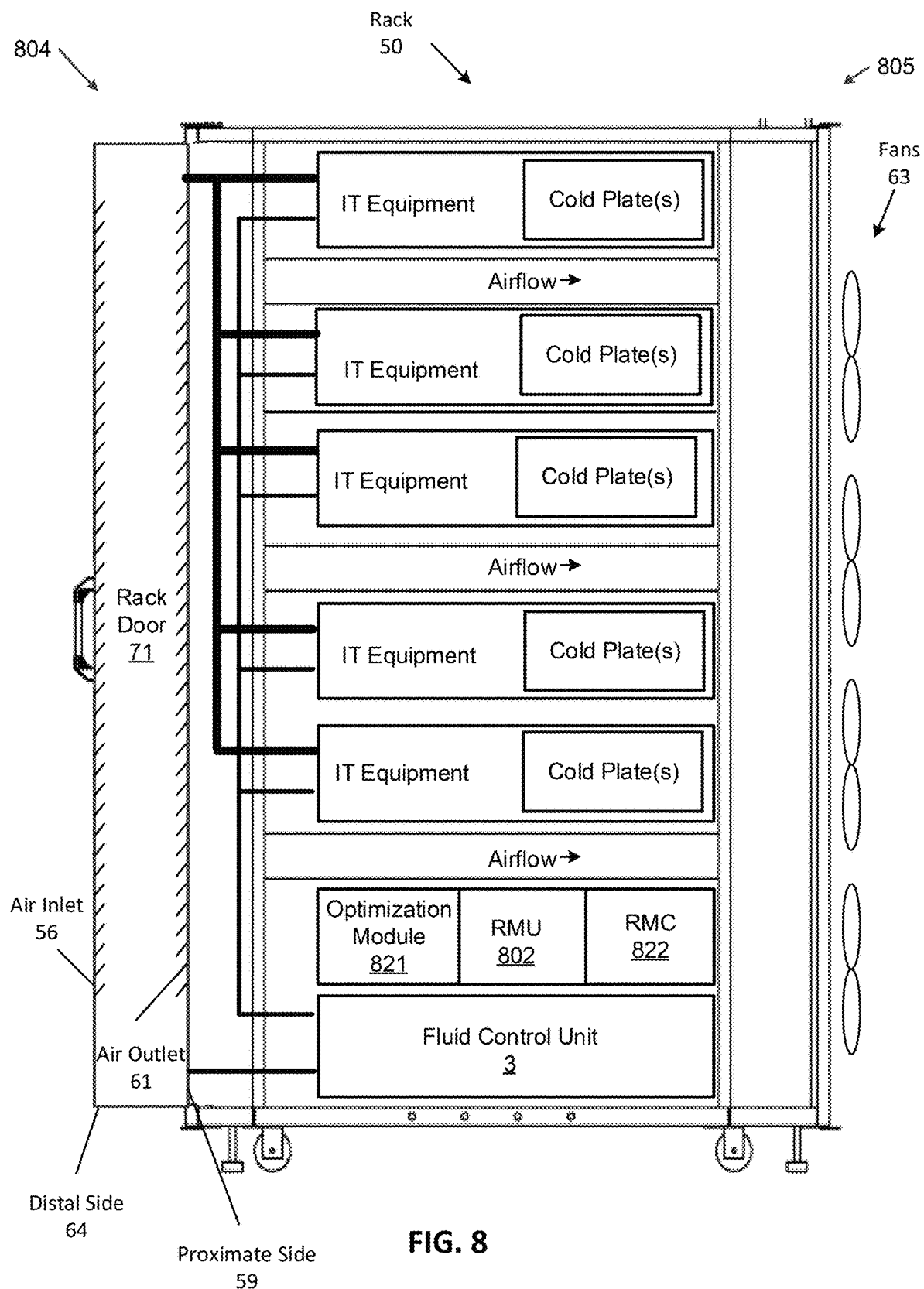
FIG. 8 is an example of an electronic rack with a cooling system according to one embodiment.
Figure 9:
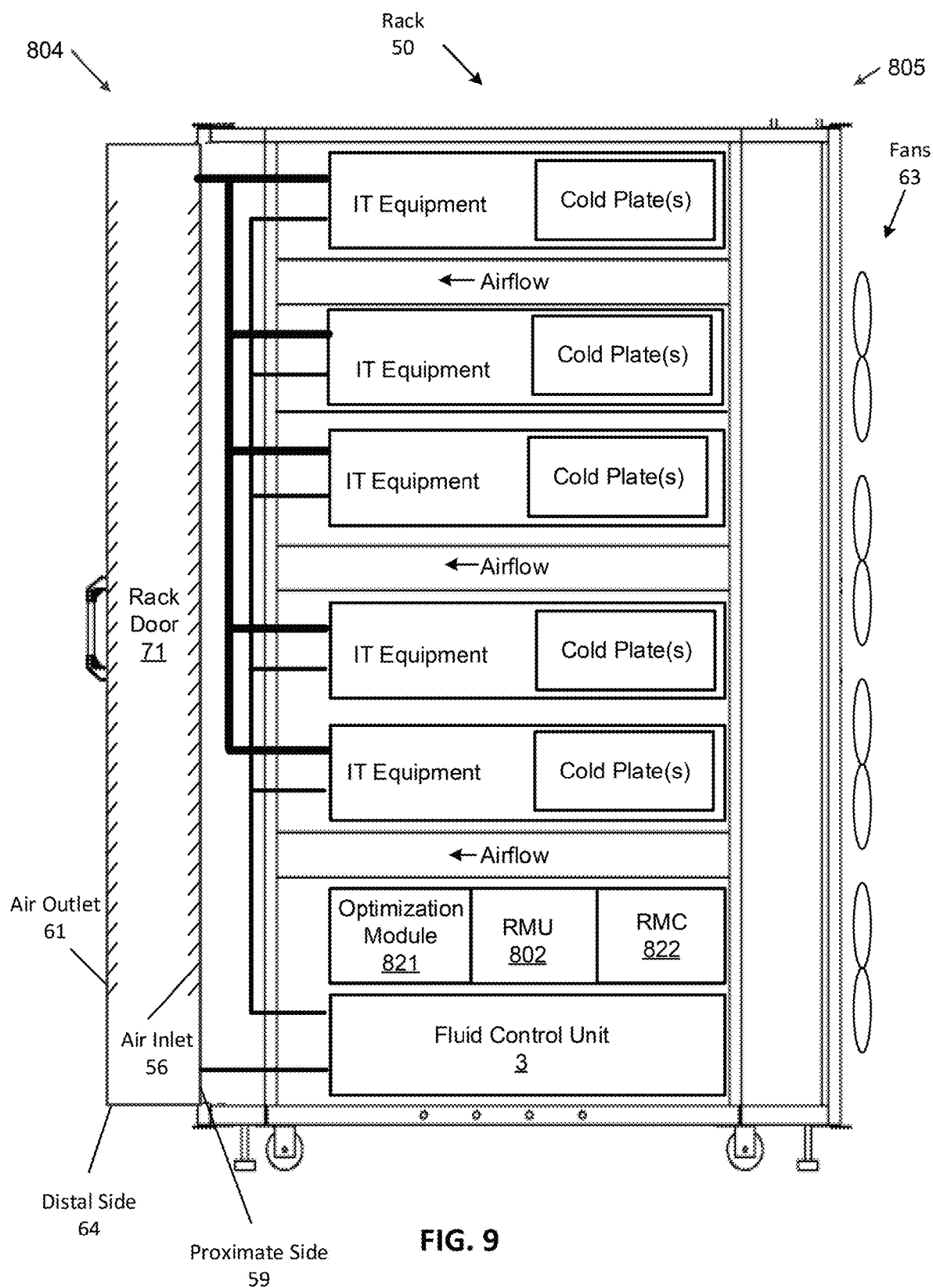
FIG. 9 is an example of an electronic rack with a cooling system according to one embodiment.

In one embodiment, the air inlet 56 and air outlet 61 may be positioned differently based on a desired air flow and/or a desired rack configuration. FIGS. 7-9 illustrate examples of different heat exchanger rack door configurations. For instance, FIG. 7 illustrates that the air inlet 56 is on a distal side 64, while the air outlet 61 is on a proximate side 59. Thus, in order to condense the vapor, cooling air flows from back to front by first passing through the door 51 and then traveling through the rack frame and out the frontend 804 of the rack.

In one embodiment, rather than (or in addition to) having a rear door heat exchanger, the rack 50 may include a front door heat exchanger. FIGS. 8 and 9 illustrate an example of the rack 50 including a front door heat exchanger 71. In FIG. 8, the air inlet 56 is on a distal side 64 of the rack door and the air outlet 61 is on the proximate side 59 of the door. Thus, the cooling air flows into the rack door 71, through the inside of the rack, and out the backend 805. In FIG. 9, the air inlet and air outlet are switched. Thus, in this example, the cooling air first travels through the inside of the rack before entering the rack 71 at the air inlet 56 that is located at the proximate side 59.

Figure 10:
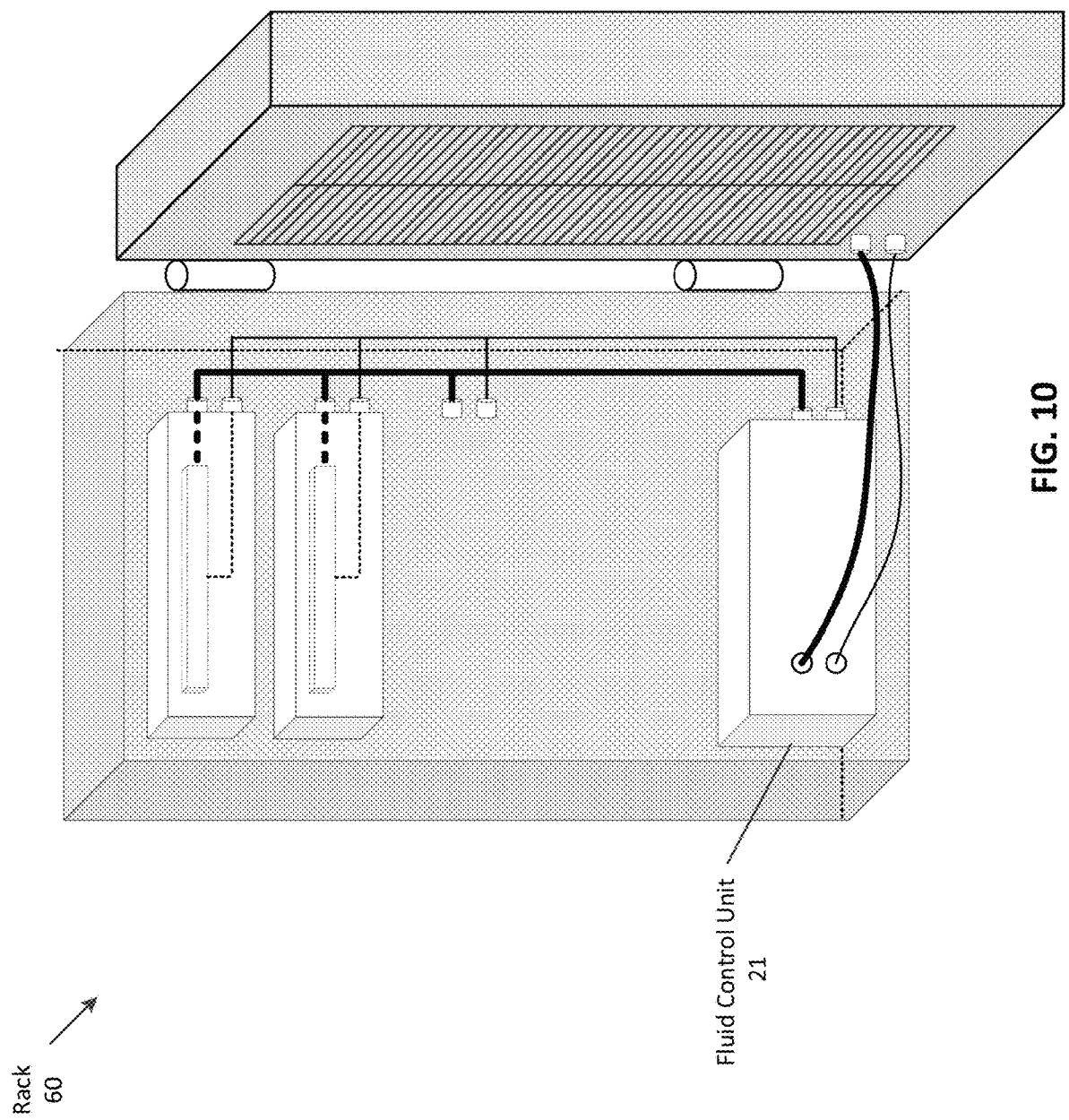
FIG. 10 is another example of an electronic rack with a cooling system according to one embodiment.

FIG. 10 is another example of an electronic rack with a cooling system according to one embodiment. Specifically, this figure shows a perspective view of an electronic rack 60 that includes an electronic rack cooling system, such as cooling system 20 of FIGS. 2 and 3. As described herein, the fluid control unit 21 couples to the vapor manifold and the liquid manifold, and couples to the rear door heat exchanger. Thus, the fluid control unit 21 includes two pairs of ports, one pair couples to the manifolds, while the other pair couples to the supply line and return line that are in turn coupled to the inlet return port and outlet supply port of the rear door heat exchanger. In one embodiment, the fluid control unit may be positioned differently within the rack. For example, since vapor rises, the fluid control unit may be positioned above the pieces of IT equipment.

Figure 11:
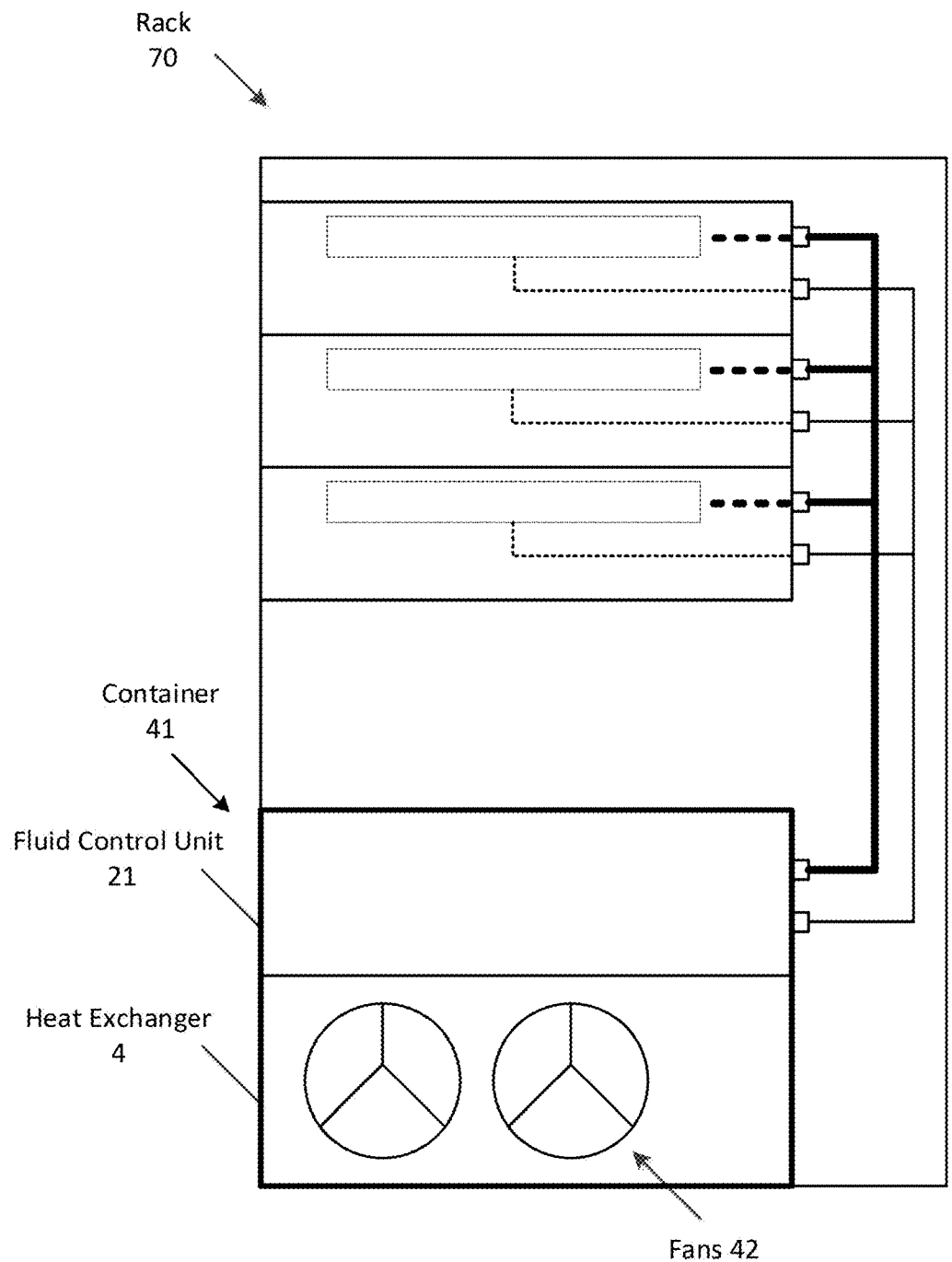
FIG. 11 is another example of an electronic rack with a cooling system according to one embodiment.

FIG. 11 is another example of an electronic rack with a cooling system according to one embodiment. Specifically, this figure shows a rear view of an electronic rack 70 that includes an electronic rack cooling system, such as cooling system 40 of FIG. 4. In this figure, the heat exchanger 4 and the fluid control unit 21 are housed within the rack frame (e.g., within a container 41). In one embodiment, the fluid control unit may be housed inside the rack frame separately from the heat exchanger 4. As illustrated, the heat exchanger 40 includes one or more fans 42, which are configured to draw ambient air from the front end of the rack, through the heat exchanger, and out the backend. In one embodiment, the rack 70 may include a front (and rear) door that allows ambient air to pass through into (and out of) the rack.

Figure 12:
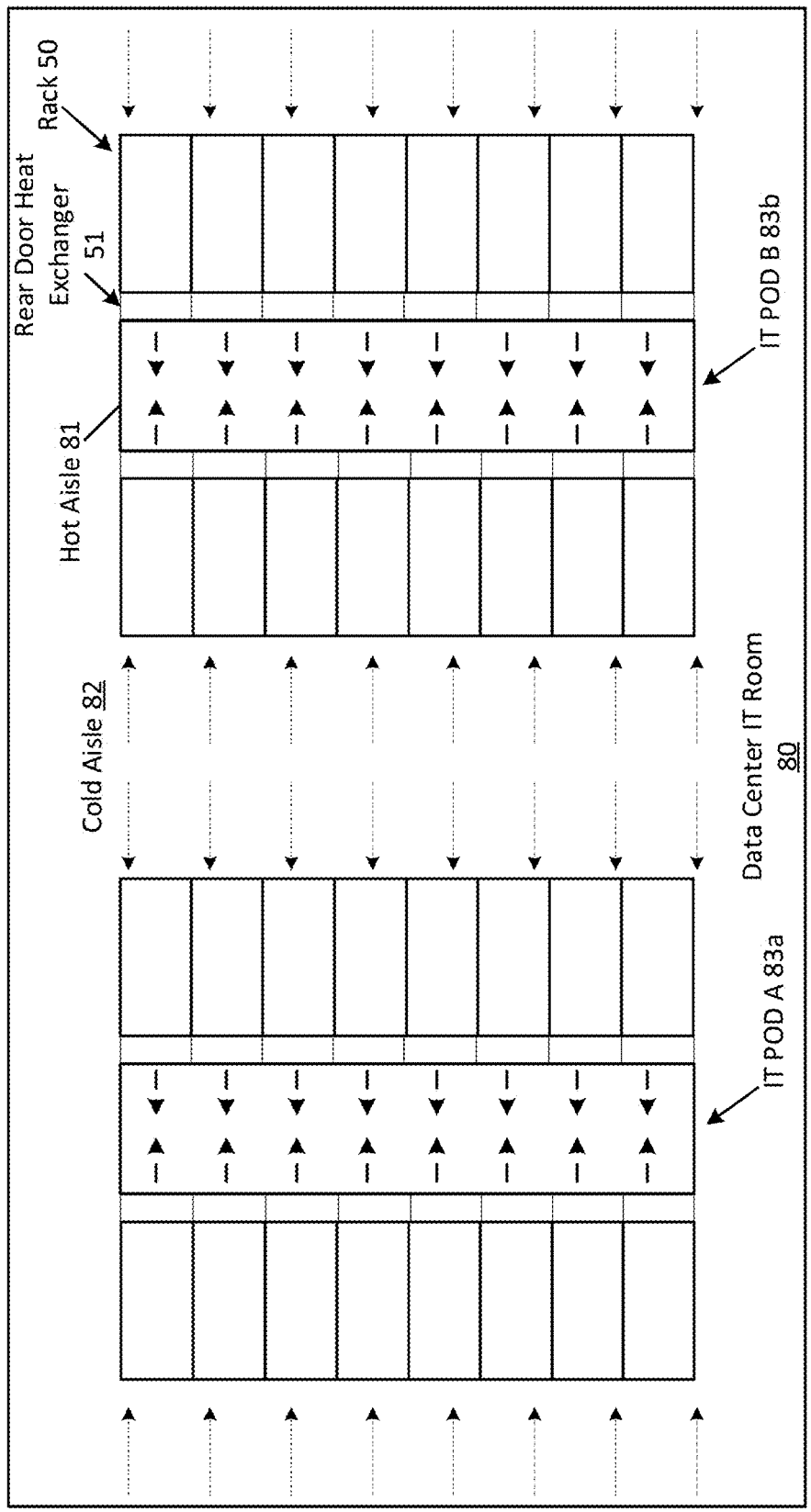
FIG. 12 is a block diagram illustrating a data center Information Technology (IT) room with installed electronic racks with a cooling system according to one embodiment.

FIG. 12 is a block diagram illustrating an air cooled data center Information Technology (IT) room that has electronic racks with a cooling system according to one embodiment. Specifically, this figure illustrates a data center IT room 80 (of a data center) with two IT PODs, POD A 83a and POD B 83b. Each POD is surrounded by a cold aisle 82, and has a hot aisle 81 in the middle of the POD. Both IT PODs are populated with eight electronic racks 50 on each side of the hot aisle, where each rack includes a rear door heat exchanger 51. Thus, each of the racks draws cool air from the cold aisle 82 in order transfer heat contained within vapor that is in the condenser coil of the rear door heat exchanger 51 into the cool air, thereby producing hot exhaust air that is pushed into the hot aisle 63. This design enables for air cooled components within the rack to be cooled in addition to liquid cooled components that are coupled to cold plates of the electronic rack cooling system within the rack. In one embodiment, at least some of the racks may include front door heat exchangers. In another embodiment, at least some of the racks installed within the data center IT room may be any of the racks described herein (e.g., racks 50, 60, and/or 70).

As previously explained, an embodiment of the disclosure may be (or include) a non-transitory machine-readable medium (such as microelectronic memory) having stored thereon instructions, which program one or more data processing components (generically referred to here as a "processor") to perform cooling operations, such the flow rate of one or more liquid pumps and/or one or more vapor pumps, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A cooling system for an electronic rack, the cooling system comprising:
    a liquid manifold and a vapor manifold;
    a cold plate that is coupled to a piece of information technology (IT) equipment for liquid cooling, wherein the cold plate is coupled to the liquid manifold to receive cooling liquid, wherein the vapor manifold is coupled to the cold plate to receive vapor that is produced by the cold plate when heat generated by the piece of IT equipment is transferred into the cooling liquid by the cold plate thereby causing at least some of the cooling liquid to turn into the vapor;
    a rack door two-phase air-to-liquid heat exchanger that is coupled to a rack frame of the electronic rack, the rack door two-phase air-to-liquid heat exchanger comprising a condenser coil configured to receive the vapor from the vapor manifold and condense the vapor back into the cooling liquid by transferring heat carried by the vapor to cooling air that passes over the condenser coil, wherein the transferring of heat produces hot exhaust air that is expelled out of the electronic rack; and
    a fluid control unit that comprises:
        a cooling liquid path that couples the liquid manifold to the condenser coil of the rack door two-phase airto-liquid heat exchanger, the cooling liquid path includes a liquid pump that is configured to draw the cooling liquid condensed by the condenser coil and push the drawn cooling liquid to the cold plate via the liquid manifold, and
a vapor path that couples the vapor manifold to the condenser coil of the rack door two-phase air-to-liquid heat exchanger, the vapor path includes a vapor pump that is configured to draw the vapor from the vapor manifold and push the drawn vapor into the condenser coil.

2. The cooling system of claim 1, wherein the cooling liquid path further includes a reservoir that is configured to hold the cooling liquid condensed by the condenser coil, wherein the liquid pump draws the cooling liquid from the reservoir.

3. The cooling system of claim 1, wherein the fluid control unit comprises a container in which the cooling liquid path and the vapor path are housed.

4. The cooling system of claim 1, wherein the rack door two-phase air-to-liquid heat exchanger is either coupled to a backend or a frontend of the rack frame.

5. The cooling system of claim 1, wherein the vapor path and the cooling liquid path are coupled directly to an inlet and outlet, respectively, of the condenser coil.

6. The cooling system of claim 5, further comprising at least one fan that is configured to push the cooling air into the rack door two-phase air-to-liquid heat exchanger.

7. An electronic rack of a data center, comprising:
a rack frame;
a plurality of pieces of IT equipment arranged in a stack for providing data processing services, at least one piece of IT equipment coupled to a cold plate;
a liquid manifold that is coupled to the cold plate to provide cooling liquid to the cold plate;
a vapor manifold that is coupled to the cold plate to receive vapor that is produced by the cold plate when heat generated by the at least one piece of IT equipment is transferred into the cooling liquid by the cold plate, thereby causing at least some of the cooling liquid to turn into the vapor;
a rack door two-phase air-to-liquid heat exchanger that is coupled to the rack frame, the rack door two-phase air-to-liquid heat exchanger comprising a condenser coil configured to receive the vapor from the vapor manifold and condense the vapor back into the cooling liquid by transferring heat carried by the vapor to cooling air that passes over the condenser coil, wherein the transferring of heat produces hot exhaust air that is expelled out of the electronic rack; and,
a fluid control unit comprising:
a cooling liquid path that couples the liquid manifold to the condenser coil of the rack door two-phase air-to-liquid heat exchanger, the cooling liquid path includes a liquid pump that is configured to draw the cooling liquid condensed by the condenser coil and push the drawn cooling liquid to the cold plate via the liquid manifold, and
a vapor path that couples the vapor manifold to the condenser coil of the rack door two-phase air-to-liquid heat exchanger, the vapor path includes a vapor pump that is configured to draw the vapor from the vapor manifold and push the drawn vapor into the condenser coil.

8. The electronic rack of claim 7, wherein the rack frame houses the plurality of pieces of IT equipment, the liquid manifold, the vapor manifold, and the fluid control unit, wherein the rack door two-phase air-to-liquid heat exchanger is coupled to a backend of the rack frame.

9. The electronic rack of claim 8, wherein the rack door two-phase air-to-liquid heat exchanger includes an air inlet on the side proximate to the rack frame and an air outlet on a side distal to the rack frame, wherein the cooling air enters the air inlet to produce the hot exhaust air that exits the electronic rack through the air outlet.

10. The electronic rack of claim 7, wherein the cooling liquid path further includes a reservoir that is configured to hold the cooling liquid condensed by the condenser coil, wherein the liquid pump draws the cooling liquid from the reservoir.

11. The electronic rack of claim 7, wherein the fluid control unit comprises a container in which the cooling liquid path and the vapor path are housed.

12. The electronic rack of claim 7, wherein the rack door two-phase air-to-liquid heat exchanger is coupled to either a backend or a frontend of the rack frame.

13. The electronic rack of claim 7, wherein the vapor path and the cooling liquid path are coupled directly to an inlet and outlet, respectively, of the condenser coil.

14. The electronic rack of claim 7, wherein the rack door heat exchanger includes at least one fan that is configured to push the cooling air into an air inlet of the rack door two-phase air-to-liquid heat exchanger.

15. The electronic rack of claim 7, further comprising at least one fan that is configured to pull the cooling air into an air inlet of the rack door two-phase air-to-liquid heat exchanger.

16. A data center comprising:
a plurality of electronic racks, wherein each of the electronic racks includes
a rack frame;
a plurality of pieces of IT equipment arranged in a stack for providing data processing services, at least one piece of IT equipment coupled to a cold plate;
a liquid manifold that is coupled to the cold plate to provide cooling liquid to the cold plate;
a vapor manifold that is coupled to the cold plate to receive vapor that is produced by the cold plate when heat generated by the at least one piece of IT equipment is transferred into the cooling liquid by the cold plate, thereby causing at least some of the cooling liquid to turn into the vapor;
a rack door two-phase air-to-liquid heat exchanger that is coupled to the rack frame, the rack door two-phase air-to-liquid heat exchanger comprising a condenser coil configured to receive the vapor from the vapor manifold and condense the vapor back into the cooling liquid by transferring heat carried by the vapor to cooling air that passes over the condenser coil, wherein the transferring of heat produces hot exhaust air that is expelled out of the electronic rack; and
a fluid control unit comprises:
a cooling liquid path that couples the liquid manifold to the condenser coil of the rack door two-phase air-to-liquid heat exchanger, the cooling liquid path includes a liquid pump that is configured to draw the cooling liquid condensed by the condenser coil and push the drawn cooling liquid to the cold plate via the liquid manifold, and
a vapor path that couples the vapor manifold to the condenser coil of the rack door two-phase air-to-liquid heat exchanger, the vapor path including a vapor pump that is configured to draw the vapor form the vapor manifold and push the drawn vapor into the condenser coil.

17. The data center of claim 16, wherein the rack frame houses the plurality of pieces of IT equipment, the liquid manifold, the vapor manifold, and the fluid control unit, wherein the rack door two-phase air-to-liquid heat exchanger is coupled to a backend of the rack frame, wherein the rack door two-phase air-to-liquid heat exchanger includes an air inlet on a side proximate to the rack frame and an air outlet on a side distal to the rack frame, wherein the cooling air enters the air inlet to produce the hot exhaust air that exits the electronic rack through the air outlet.

18. The data center of claim 16, wherein the cooling path further includes a reservoir that is configured to hold the cooling liquid condensed by the condenser coil, wherein the liquid pump draws the cooling liquid from the reservoir.

19. The data center of claim 18, wherein the fluid control unit comprises a container in which the cooling liquid path and the vapor path are housed.

20. The data center of claim 16, wherein, in response to the fluid control unit failing, the heat exchanging loop remains active to draw heat away from the at least one piece of IT equipment by enabling natural convection cooling for a period of time.

* * * * *